United States Patent
Kim et al.

(10) Patent No.: US 8,000,166 B2
(45) Date of Patent: Aug. 16, 2011

(54) SEMICONDUCTOR MEMORY DEVICE AND OPERATING METHOD THEREOF

(75) Inventors: Kyung-Hoon Kim, Gyeonggi-do (KR); Sang-Sic Yoon, Gyeonggi-do (KR); Bo-Kyeom Kim, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 437 days.

(21) Appl. No.: 12/277,609

(22) Filed: Nov. 25, 2008

(65) Prior Publication Data

US 2009/0323444 A1 Dec. 31, 2009

(30) Foreign Application Priority Data

Jun. 30, 2008 (KR) .......................... 10-2008-0063176

(51) Int. Cl.
*G11C 8/18* (2006.01)
(52) U.S. Cl. .......... 365/233.12; 365/233.11; 365/189.05
(58) Field of Classification Search ............. 365/233.12, 365/233.11, 189.05
See application file for complete search history.

(56) References Cited

U.S. PATENT DOCUMENTS

| | | | |
|---|---|---|---|
| 5,600,267 A | | 2/1997 | Wong et al. |
| 6,166,990 A | * | 12/2000 | Ooishi et al. ............. 365/233.11 |
| 6,343,036 B1 | * | 1/2002 | Park et al. ..................... 365/193 |
| 6,442,225 B1 | | 8/2002 | Huang |
| 6,597,235 B2 | | 7/2003 | Choi |
| 6,757,212 B2 | * | 6/2004 | Hamamoto et al. ...... 365/233.11 |
| 6,859,079 B2 | | 2/2005 | Haraguchi et al. |
| 2002/0141280 A1 | * | 10/2002 | Hamamoto et al. .......... 365/233 |

FOREIGN PATENT DOCUMENTS

KR 1020060130440 A 12/2006

OTHER PUBLICATIONS

Notice of Allowance issued from Korean Intellectual Property Office on Jul. 28, 2009 with an English Translation.

* cited by examiner

*Primary Examiner* — Tuan T. Nguyen
(74) *Attorney, Agent, or Firm* — IP & T Group LLP

(57) ABSTRACT

A semiconductor memory device including a first clock transmission path configured to receive a source clock swinging at a CML level through a clock transmission line in response to an enable signal, and to convert the source clock into a clock swinging at a CMOS level. The device also includes a second clock transmission path configured to convert the source clock in a clock swinging at a CMOS level in response to the enable signal, and to output the converted clock through the clock transmission line and a data output unit configured to output data in response to output clocks of the first and second clock transmission lines.

45 Claims, 5 Drawing Sheets

SEMICONDUCTOR MEMORY DEVICE AND OPERATING METHOD THEREOF

CROSS-REFERENCE TO RELATED APPLICATIONS

The present invention claims priority of Korean patent application number 10-2008-0063176, filed on Jun. 30, 2008, which is incorporated by reference in its entirety.

BACKGROUND OF THE INVENTION

The present invention relates to a semiconductor design technology, and in particular, to a path through which a clock swinging at a current mode logic (CML) level is transmitted in a semiconductor memory device. More particularly, the invention relates to a multiplexing of a path through which a clock swinging at a CML level is transmitted in a semiconductor memory device.

Generally, a semiconductor memory device uses a signal swinging at a CML level in an input/output (I/O) interface of a high frequency signal such as a clock. A CML level is a voltage level of a range defined by a predefined DC voltage level. A signal swinging at a CML level is a signal that toggles at a predefined frequency between a maximum voltage level (Vmax) and a minimum voltage level (Vmin) of a CML level, based on a reference voltage level within a CML level.

For example, even though a power supply voltage (VDD) level of a device for inputting/outputting a signal swinging at a CML level is 1.5 V and a ground voltage (VSS) level is 0 V, the CML level can be defined as 1.0 V instead of 1.5 V. A reference voltage level of the CML level is 1.25 V, and a signal swinging at the CML level toggles at a predefined frequency in such a state that it has a swing width of 0.5 V with respect to 1.25 V.

As described in the above example, the CML level is designed such that its magnitude is smaller than that of a voltage level region due to a difference between a power supply voltage (VDD) level and a ground voltage (VSS) level of a device for inputting/outputting a signal swinging at a CML level. This is because the signal swinging at the CML level is mainly a clock having a high frequency.

That is, the CML level is designed such that it can be stably transmitted even in the clock having a high frequency more than Giga hertz or tens of Giga hertz. However, since the magnitude of the CML level is relatively small, the swing width of the signal swinging at the CML level is relatively small. Therefore, the signal swinging at the CML level cannot be used as data whose logic level is determined according to voltage level variation. That is, the signal swinging at the CML level is suitable for the clock having a high frequency, but it is unsuitable for the data whose logic level is determined according to voltage level variation.

Therefore, a data input/output device uses the signal swinging at the CMOS level having a relatively large swing width, instead of the signal swinging at the CML level.

The CMOS level means a voltage level due to a difference between the power supply voltage (VDD) level and the ground voltage (VSS) level. The signal swinging at the CMOS level is a signal that toggles at a predefined frequency between a maximum voltage level (Vmax) and a minimum voltage level (Vmin) of a CMOS level, based on a reference voltage level within a CMOS level, that is, half of a voltage level between the power supply voltage (VDD) level and the ground voltage (VSS) level.

As described in the above example, in the case of the CMOS level, even though the power supply voltage (VDD) level is 1.5 V and the ground voltage (VSS) level is 0 V, voltage levels of 1.5 V and 1.0 V are specified as the CML level and thus the swing width of the signal swinging at the CML level may be 0.5 V. In the case of the CMOS level, if the power supply voltage (VDD) level is 1.5 V and the ground voltage (VSS) level is 0 V, the voltage levels of 1.5 V and 0 V are determined as the CMOS level and thus the swing width of the signal swinging at the CMOS level is always 1.5 V.

Therefore, the swing width of the signal swinging at the CMOS level is larger than that of the signal swinging at the CML level. This means that the signal swinging at the CMOS level can be suitably used as the data whose logic level is determined according to the voltage level.

For reference, as described above, it is usual that the signal swinging at the CML level toggles at a small swing width at the high frequency. Therefore, there is a high probability that the phase of the signal will be distorted or the voltage level thereof will be varied due to noise generated during transmission. Upon transmission of the signal swinging at the CML level, the signal is divided into two signals having opposite phases and the two signals are simultaneously transmitted.

On the contrary, it is usual that the signal swinging at the CMOS level toggles at a large swing width at a low frequency. Therefore, there is a low probability that the phase of the signal will be distorted and the voltage level thereof will be varied due to noise generated during transmission. Upon transmission of the signal swinging at the CMOS level, the signal is solely transmitted. In some cases, like the signal swinging at the CML level, the signal swinging at the CMOS level is divided into two signals having opposite phases and the two signals are simultaneously transmitted.

FIG. 1 illustrates a circuit for generating or transmitting a signal swinging at a CML level and a circuit for generating and transmitting a signal swinging at a CMOS level in a conventional semiconductor memory device.

It will be assumed that the signals CML_SGI and CML_SIGB swinging at the CML level and the signals CMOS_SIG and CMOS_SIGB swinging at the CMOS level are respectively divided into two signals having opposite phases and then simultaneously transmitted. Referring to FIG. 1, the circuit 100 for generating or transmitting the signals CML_SIG and CML_SIGB swinging at the CML level includes a first NMOS transistor N1, a second NMOS transistor N2, a third NMOS transistor N3, and first and second resistors R1 and R2. The first NMOS transistor N1 has a gate receiving a positive input signal INPUT_SIG, a drain connected to a negative output node OUT_NDB, and a source connected to a common node COMN, and adjusts an amount of current I1 flowing between the negative output node OUT_NDB and the common node COMN in response to the positive input signal INPUT_SIG. The second NMOS transistor N2 has a gate receiving a negative input signal INPUT_SIGB, a drain connected to a positive output node OUT_ND, and a source connected to the common node COMN, and adjusts an amount of current I2 flowing between the positive output node OUT_ND and the common node COMN in response to the negative input signal INPUT_SIGB. The third NMOS transistor N3 has a gate receiving a CML bias voltage CML_BIAS, a drain connected to the common node COMN, and a source connected to a ground voltage (VSS) terminal, and adjusts an amount of current I3 flowing between the common node COMN and the ground voltage (VSS) terminal in response to the CML bias voltage CML_BIAS, thereby adjusting an amount of sinking current I3 flowing out from the common node COMN. The first resistor R1 is connected between a power supply voltage (VDD) terminal and the negative output node OUT_NDB to adjust the swing width of the signal CML_SIGB output through the negative output node OUT_NDB and swinging at the CML level. The second resistor R2 is connected between the power supply voltage (VDD) terminal and the positive output node OUT_ND to adjust the swing width of the signal CML_SIG output through the positive output node OUT_ND and swinging at the CML level. The first and second resistors R1 and R2 have the same resistance.

An operation of the circuit 100 for generating or transmitting the signals CML_SIG and CML_SIGB swinging at the CML level in the conventional semiconductor memory device.

First, the positive input signal INPUT_SIG and the negative input signal INPUT_SIGB have opposite phases. Also, the CML bias signal CML_BIAS always has a logic high level. Therefore, the third NMOS transistor N3 is always turned on to discharge a predetermined amount of current from the common node COMN to the ground voltage (VSS) terminal. In such a state, if the voltage level of the positive input signal INPUT_SIG increases to turn on the first NMOS transistor N1, the voltage level of the negative input signal INPUT_SIGB decreases to turn off the second NMOS transistor N2. Thus, a predefined amount of current I1 flows from the negative output node OUT_NDB to the common node COMN, but a current I2 does not flow from the positive output node OUT_ND to the common node COMN.

That is, an amount of current I1 flowing from the negative output node OUT_NDB to the common node COMN is equal to an amount of current I3 flowing from the common node COMN to the ground voltage (VSS) terminal.

Consequently, the voltage level of the signal CML_SIGB output through the negative output node OUT_NDB and swinging at the CML level decreases, and the voltage level of the signal CML_SIG output through the positive output node OUT_ND and swinging at the CML level increases.

On the contrary, if the voltage level of the positive input signal INPUT_SIG decreases to turn off the first NMOS transistor N1, the voltage level of the negative input signal INPUT_SIGB increases to turn on the second NMOS transistor N2. Therefore, the current I1 does not flow from the negative output node OUT_NDB to the common node COMN, but a predefined amount of current I2 continuously flows from the positive output node OUT_ND to the common node COMN.

That is, an amount of current I2 flowing from the positive output node OUT_ND to the common node COMN is equal to an amount of current I3 flowing from the common node COMN to the ground voltage (VSS) terminal.

Consequently, the voltage level of the signal CML_SIGB output through the negative output node OUT_NDB and swinging at the CML level increases, and the voltage level of the signal CML_SIG output through the positive output node OUT_ND and swinging at the CML level decreases.

The decreasing degrees of the voltage levels of the signals CML_SIG and CML_SIGB swinging at the CML level are changed according to the resistances of the first and second resistors R1 and R2. This is because that the degrees determining the decreasing states of the voltage levels of the signals CML_SIG and CML_SIGB swinging at the CML levels may be changed according to potentials varying while the current I1 or I2 continuously flowing from the power supply voltage (VDD) terminal through the positive output node OUT_NDB or the negative output node OUT_ND to the ground voltage (VSS) terminal are passing through the first resistor R1 and the first and third NMOS transistors N1 and N3 or the second resistor R2 and the second and third NMOS transistors N2 and N3.

Specifically, even though the first NMOS transistor N1 and the third NMOS transistor N3 are sequentially turned on by the input signal INPUT_SIG and the CML bias signal CML_BIAS, or the second NMOS transistor N2 and the third NMOS transistor N3 are sequentially turned on by the input signal INPUT_SIGB and the CML bias signal CML_BIAS, the circuit 100 may have a very small resistance component due to the turned-on state of the transistors.

Therefore, the voltage levels of the signals CML_SIG and CML_SIGB swinging at the CML levels are determined by a voltage division law that is formed while the current I1 flows through the first resistor R1, the first NMOS transistor N1 and the third NMOS transistor N3. Also, the voltage levels of the signals CML_SIG and CML_SIGB swinging at the CML levels are determined by a voltage division law that is formed while the current I2 flows through the second resistor R2, the second NMOS transistor N2 and the third NMOS transistor N3.

Since the first resistor R1 and the second resistor R2 have the same resistance, the voltage levels of the signals CML_SIG and CML_SIGB swinging at the CML level are relatively closer to the ground voltage (VSS) level as the resistances of the first resistor R1 and the second resistor R2 become larger. As the resistances of the first resistor R1 and the second resistor R2 become smaller, the voltage levels of the signals CML_SIG and CML_SIGB swinging at the CML level are relatively far from the ground voltage (VSS) level. That is, as the resistances of the first resistor R1 and the second resistor R2 become larger, the swing widths of the signals CML_SIG and CML_SIGB swinging at the CML level are relatively larger. As the resistances of the first resistor R1 and the second resistor R2 become smaller, the swing widths of the signals CML_SIG and CML_SIGB are relatively smaller.

Meanwhile, the increasing degrees of the voltage levels of the signals CML_SIG and CML_SIGB swinging at the CML level are determined in a state that the currents do not continuously flow through the first resistors R1 and the second resistor R2. Therefore, when voltage levels of the signals CML_SIG and CML_SIGB swinging at the CML level are increased, they are almost equal to the power supply voltage (VDD) level.

A circuit 120 for generating or transmitting the signals CMOS_SIG and CMOS_SIGB swinging at a CMOS level in the conventional semiconductor memory device includes a first PMOS transistor P1, a first NMOS transistor N4, a second PMOS transistor P2, an a second NMOS transistor N5. The first PMOS transistor P1 has a gate receiving the positive input signal INPUT_SIG, a source connected to the power supply voltage (VDD) terminal, and a drain connected to a first driving node DRND1, and adjusts an amount of current I4 flowing through the power supply voltage (VDD) terminal and the first driving node DRND1 in response to the positive input signal INPUT_SIG. The first NMOS transistor N4 has a gate receiving the positive input signal INPUT_SIG, a drain connected to the first driving node DRND1, and a source connected to the ground voltage (VSS) terminal, and adjusts an amount of current I5 flowing between the first driving node DRND1 and the ground voltage (VSS) terminal in response to the positive input signal INPUT_SIG. The second PMOS transistor P2 has a gate receiving the negative input signal INPUT_SIGB, a source connected to the power supply voltage (VDD) terminal, and a drain connected to a second driving node DRND2, and adjusts an amount of current I6 flowing between the power supply voltage (VDD) terminal and the second driving node DRND2 in response to the negative input signal INPUT_SIGB. The second NMOS transistor N5 has a gate receiving the negative input signal INPUT_SIGB, a drain connected to the second driving node DRND2, a source connected to the ground voltage (VSS) terminal, and adjusts an amount of current I7 flowing between the second driving node DRND2 and the ground voltage (VSS) terminal in response to the negative input signal INPUT_SIGB.

An operation of the circuit 120 for generating or transmitting the signals CMOS_SIG and CMOS_SIGB swinging at the CMOS level in the above-described semiconductor memory device will be described below.

First, the positive input signal INPUT_SIG and the negative input signal INPUT_SIGB have opposite phases.

Therefore, when the voltage level of the positive input signal INPUT_SIG increases to turn off the first PMOS transistor P1 and turn on the first NMOS transistor N4, the voltage level of the negative input signal INPUT_SIGB decreases to turn on the second PMOS transistor P2 and turn off the second NMOS transistor N5.

Thus, a predefined amount of the current I5 flows from the first driving node DRND1 to the ground voltage (VSS) terminal, but the current I4 does not flow from the power supply voltage (VDD) terminal to the first driving node DRND1.

Likewise, a predefined amount of the current I6 flows from the power supply voltage (VDD) terminal to the second driving node DRND2, but the current I7 does not flow from the second driving node DRND2 to the ground voltage (VSS) terminal.

Therefore, the voltage level of the first driving node DRND1 falls to a level substantially equal to the ground voltage (VSS) level, and the voltage level of the second driving node DRND2 rises to a level substantially equal to the power supply voltage (VDD) level.

The predefined amount of the current I5 flows from the first driving node DRND1 to the ground voltage (VSS) terminal only until the voltage level of the first driving node DRND1 falls to the level substantially equal to the ground voltage (VSS) level, and it does not flow any more when the voltage level of the first driving node DRND1 falls to the level substantially equal to the ground voltage (VSS) level. That is, the predefined amount of the current I5 flowing from the first driving node DRND1 to the ground voltage (VSS) terminal is a current that instantaneously flows when the voltage level of the positive input signal INPUT_SIG rises.

Likewise, the predefined amount of the current I6 flows from the power supply voltage (VDD) terminal to the second driving node DRND2 only until the voltage level of the second driving node DRND2 rises to the level substantially equal to the power supply voltage (VDD) level, and it does not flow any more when the voltage level of the second driving node DRND2 rises to the level substantially equal to the power supply voltage (VDD) level. That is, the predefined amount of the current I6 flowing from the power supply voltage (VDD) terminal to the second driving node DRND2 is a current that instantaneously flows when the voltage level of the negative input signal INPUT_SIGB falls.

When the voltage level of the positive input signal INPUT_SIG decreases to turn on the first PMOS transistor P1 and turn off the first NMOS transistor N4, the voltage level of the negative input signal INPUT_SIGB increases to turn off the second PMOS transistor P2 and the turn on the second NMOS transistor N5.

Thus, the current I5 does not flow from the first driving node DRND1 to the ground voltage (VSS) terminal, but the predefined amount of the current I4 flows from the power supply voltage (VDD) terminal to the first driving node DRND1.

Likewise, the current I6 does not flow from the power supply voltage (VDD) terminal to the second driving node DRND2, but the predefined amount of the current I7 flows from the second driving node DRND2 to the ground voltage (VSS) terminal.

Therefore, the voltage level of the second driving node DRND2 falls to a level substantially equal to the ground voltage (VSS) level, and the voltage level of the first driving node DRND1 rises to a level substantially equal to the power supply voltage (VDD) level.

In this case, the predefined amount of the current I4 flows from the power supply voltage (VDD) terminal to the first driving node DRND1 only until the voltage level of the first driving node DRND1 rises to the level substantially equal to the power supply voltage (VDD) level, and it does not flow any more when the voltage level of the first driving node DRND1 rises to the level substantially equal to the power supply voltage (VDD) level. That is, the predefined amount of the current I4 flowing from the power supply voltage (VDD) terminal to the first driving node DRND1 is a current that instantaneously flows when the voltage level of the positive input signal INPUT_SIG falls.

Likewise, the predefined amount of the current I7 flows from the second driving node DRND2 to the ground voltage (VSS) terminal only until the voltage level of the second driving node DRND2 falls to the level substantially equal to the ground voltage (VSS) level, and it does not flow any more when the voltage level of the second driving node DRND2 falls to the level substantially equal to the ground voltage (VSS) level. That is, the predefined amount of the current I7 flowing from the second driving node DRND2 to the ground voltage (VSS) terminal is a current that instantaneously flows when the voltage level of the negative input signal INPUT_SIGB rises.

FIG. 2 is a graph for comparing an amount of current consumed according to variation of an operating frequency in the circuit for generating or transmitting the signals swinging at the CML level and the circuit for generating or transmitting the signals swinging at the CMOS level in the conventional semiconductor memory device of FIG. 1.

It can be seen from FIG. 2 that the circuit 100 for generating or transmitting the signals CML_SIG and CML_SIGB swinging at the CML level in the conventional semiconductor memory device consumes a constant amount of current, without regard to the variation of the operating frequency.

On the contrary, it can be seen that the circuit 120 for generating or transmitting the signals CMOS_SIG and CMOS_SIGB swinging at the CMOS level consumes a different amount of current according to the variation of the operating frequency.

First, the following description will be made on the principle that the circuit 100 for generating or transmitting the signals CML_SIG and CML_SIGB swinging at the CML level consumes a constant amount of current, without regard to the variation of the operating frequency.

Since the input signals are divided into the positive and negative input signals INPUT_SIG and INPUT_SIGB having opposite phases, one of the first NMOS transistor N1 and the second NMOS transistor N2 operating in response to the input signals INPUT_SIG and INPUT_SIGB is turned on, while the other is turned off. That is, the first NMOS transistor N1 and the second NMOS transistor N2 are controlled to operate oppositely.

At this point, since the sizes of the first NMOS transistor N1 and the second NMOS transistor N2 are equal to each other, a total amount of the currents I1 and I2 supplied from power supply voltage (VDD) terminal to the common node COMN is not varied, without regard to the variation in the voltage levels of the input signals INPUT_SIG and INPUT_SIGB or the variation in the voltage levels of the signals CML_SIG and CML_SIGB swinging at the CML level.

In addition, since the CML bias signal CML_BIAS always maintains the constant voltage level, the third NMOS transistor N3 is always maintained in the turned-on state when power is supplied to the semiconductor memory device. Therefore, the third NMOS transistor N3 can discharge a constant amount of current from the common node COMN to the ground voltage (VSS) terminal.

In this way, a constant amount of current I1 or I2 is always supplied to the common node COMN, without regard to the variation in the voltage levels of the input signals INPUT_SIG and INPUT_SIGB, and an amount of the current I3 discharged from the common node COMN to the ground voltage (VSS) terminal is constant. Thus, the voltage levels of the signals CML_SIG and CML_SIGB swinging at the CML level are varied according to the variation in the voltage levels of the input signals INPUT_SIG and INPUT_SIGB, but a total amount of current consumed is not varied.

For example, a constant amount of current is always consumed, even though the positive input signal INPUT_SIG changes from a logic low level to a logic high level, or from a logic high level to a logic low level, or the positive input signal INPUT_SIG maintains a logic low level or a logic high level.

Therefore, the circuit 100 for generating or transmitting the signals CML_SIG and CML_SIGB swinging at the CML level consumes a constant amount of current, even though the voltage levels of the input signals INPUT_SIG and INPUT_SIGB are in a high speed frequency state or a low speed frequency state.

The following description will be made on the principle that the circuit 120 for generating or transmitting the signals CMOS_SIG and CMOS_SIGB swinging at the CMOS level consumes a different amount of current according to the variation of the operating frequency.

First, the first PMOS transistor P1 and the first NMOS transistor N4 operating in response to the positive input signal INPUT_SIG will be explained. When the voltage level of the positive input signal INPUT_SIG decreases to a level lower than a predefined voltage level and thus the first PMOS transistor P1 is turned on, the first NMOS transistor N4 must be turned off. When the voltage level of the positive input signal INPUT_SIG increase to a level higher than the predefined voltage level and thus the first PMOS transistor P1 is turned off, the first NMOS transistor N4 must be turned on.

That is, the first PMOS transistor P1 and the first NMOS transistor N4 operates oppositely, but there cannot exist a direct current path flowing from the power supply voltage (VDD) terminal to the ground voltage (VSS) terminal.

Therefore, in a state that the first PMOS transistor P1 is turned on and the first NMOS transistor N4 is turned off, there exists the current I4 supplied from the power supply voltage (VDD) terminal to the first driving node DRND1 until the voltage level of the first driving node DRND1 is equal to the power supply voltage (VDD) level. In this case, the current I5 does not flow from the first driving node DRND1 to the ground voltage (VSS) terminal.

In addition, if the voltage level of the first driving node DRND1 is equal to the power supply voltage (VDD) level, the current I4 flowing from the power supply voltage (VDD) terminal to the first driving node DRND1 also disappears.

In a state that the first PMOS transistor P1 is turned off and the first NMOS transistor N4 is turned on, there exists the current I5 supplied from the first driving node DRND1 to the ground voltage (VSS) terminal until the voltage level of the first driving node DRND1 is equal to the ground voltage (VSS) level. In this case, the current I4 does not flow from the power supply voltage (VDD) terminal to the first driving node DRND1.

In addition, if the voltage level of the first driving node DRND1 is equal to the ground voltage (VSS) level, the current I5 flowing from the first driving node DRND1 to the ground voltage (VSS) terminal also disappears.

At this point, the current I5 flowing from the first driving node DRND1 to the ground voltage (VSS) terminal corresponds to the current I4 that is supplied from the power supply voltage (VDD) terminal to the first driving node DRND1 in the previous operation and stays at the first driving node DRND1, and then is discharged to the ground voltage (VSS) terminal. Therefore, an actually consumed current is the current I4 that has been supplied from the power supply voltage (VDD) terminal to the first driving node DRND1.

This phenomenon also occurs at the second PMOS transistor P2 and the second NMOS transistor N5 operating in response to the negative input signal INPUT_SIGB. However, a timing at which the current is actually consumed is different.

In the circuit 120 for generating or transmitting the signals CMOS_SIG and CMOS_SIGB swinging at the CMOS level, there exists only a direct current consumption for varying the voltage levels of the signals CMOS_SIG and CMOS_SIGB swinging at the CMOS level, which are output at a time point when the voltage levels of the input signals INPUT_SIG and INPUT_SIGB are varied.

For example, at the time when the positive input signal INPUT_SIG changes from a logic high level to a logic low level, there exists only a current consumption for changing the negative signal CMOS_SIGB from a logic low level to a logic high level. There exist no current consumption when the negative signal CMOS_SIGB maintains a logic high level or changes to a logic low level.

Therefore, the circuit 120 for generating or transmitting the signals CMOS_SIG and CMOS_SIGB swinging at the CMOS level consumes a relatively large amount of current in a high speed frequency state, where the voltage level of the input signals INPUT_SIG and INPUT_SIGB are varied at high speed, and consumes a relatively small amount of current in a low speed frequency state, where the voltage levels of the input signals INPUT_SIG and INPUT_SIGB are varied at low speed.

Meanwhile, it is usual that the semiconductor device, especially a synchronous dynamic random access memory (SDRAM) outputs data in synchronization with a clock. Likewise, it is usual that external data are input to the SDRAM in synchronization with a clock.

At this point, since data input from the outside of the SDRAM has been already synchronized with the clock, the SDRAM need not perform a special synchronization process.

However, when data are output to the outside of the SDRAM, an operation of synchronizing the data with the clock should be performed because the data is not synchronized with the clock due to the internal operation of the SDRAM.

However, due to a swing width difference between the signal swinging at the CML level and the signal swinging at the CMOS level, an error may occur when the data is directly synchronized with the clock. Upon the synchronization operation, the clock swinging at the CML level needs to be converted into the clock swinging at the CMOS level.

Therefore, an output driver of the SDRAM must include a CML-to-CMOS converter for converting the signal swinging at the CML level into the signal swinging at the CMOS level.

That is, after the clock swinging at the CML level is transmitted to the data output driver of the SDRAM, it is converted into the signal swinging at the CMOS level and synchronizes the data.

FIG. 3 is a block diagram illustrating a path through which a signal swinging at a CML level is transmitted to a data output driver in a conventional semiconductor memory device.

Referring to FIG. 3, a positive clock CML_CLK and a negative clock CML_CLKB input through a positive clock input pad CLK_IN_PAD and a negative clock input pad CLK_IN_PADB and swinging at the CML level are transmitted through a plurality of CML clock transfer units 300 and 310 to a clock converting unit 320. Then, the positive clock CML_CLK and the negative clock CML_CLKB are converted into clocks CMOS_CLK and CMOS_CLKB swinging at the CMOS level by a clock converting unit 320, and then transmitted to a data output driver 340.

The data output driver 340 transfers output data of a core region 360 to a data output pad 380 in response to the clocks CMOS_CLK and CMOS_CLKB swinging at the CMOS level.

That is, the positive clock CML_CLK and the negative clock CML_CLKB swinging at the CML level are input through the positive clock input pad CLK_IN_PAD and the negative clock input pad CLK_IN_PADB and transmitted while repeating a relatively long path through the plurality of CML clock transfer units 300 and 310. The positive clock CML_CLK and the negative clock CML_CLKB are converted into the signals swinging at the CMOS level by the clock converting unit 320 immediately before they reach the data output driver 340.

When transferring the positive clock CML_CLK and the negative clock CML_CLKB swinging at the CML level, they continuously maintain a state of swinging at the CML level. However, such a structure may cause a problem that increase an amount of current consumed according to frequencies of the positive clock CML_CLK and the negative clock CML_CLKB swinging at the CML level.

Specifically, as described above with reference to FIG. 2, when transferring the signals swinging at the CML level, a constant amount of current is consumed, without regard to frequencies of the signals swinging at the CML level.

On the other hand, when transferring the signals swinging at the CMOS level, an amount of current consumed is varied according to frequencies of the signals swinging at the CMOS level. That is, the current consumption is relatively small when the frequencies of the signals swinging at the CMOS level are low, and the current consumption is relatively large when the frequencies of the signals swinging at the CMOS level are high.

Therefore, as illustrated in FIG. 2, in the case of transferring the low frequency signal, the current consumption can be reduced by transferring the signal in a state of swinging at the CMOS level. In the case of transferring the high frequency signal, the current consumption can be reduced by transferring the signal in a state of swinging at the CML level.

Since it is usual that the input clock signal has a high frequency, the current consumption can be reduced by maintaining the clock signal in state of swinging at the CML level inside the semiconductor memory device and converting it into the CMOS level immediately before it reaches the data output driver 340.

However, this structure is configured on the assumption that the input clock signal has a high frequency. If the input clock signal has a low frequency, the current consumption will be increased.

That is, the structure of FIG. 3 can reduce the current consumption only when the semiconductor memory device operates at a normal mode. However, the current consumption is increased at a low speed operation test mode for testing the semiconductor memory device by using a low frequency clock, at a low power test mode for multi die test, and under a low power or low speed frequency environment, such as a low power mode that is widely used in a mobile environment.

Therefore, the semiconductor memory device intended to be used under the low power or low speed frequency environment cannot be tested normally, and the test time increases. In particular, it is impossible to normally implement the mobile environment where the semiconductor memory device should operate at a low power mode.

SUMMARY OF THE INVENTION

Embodiments of the present invention are directed to providing a semiconductor memory device, which is capable of maintaining a minimum current consumption without regard to operation modes by multiplexing a transfer path of a clock swinging at a CML level.

In accordance with an aspect of the invention, there is provided a first clock transmission path configured to receive a source clock swinging at a CML level through a clock transmission line in response to an enable signal, and convert the source clock into a clock swinging at a CMOS level, a second clock transmission path configured to convert the source clock in a clock swinging at a CMOS level in response to the enable signal, and output the converted clock through the clock transmission line and a data output unit configured to output data in response to output clocks of the first and second clock transmission lines.

In accordance with other aspect of the invention, there is provided a first clock driving unit configured to transfer a source clock swinging at a CML level to a clock transmission line in response to an enable signal, a first clock converting unit configured to convert a swing region of the clock, which is transmitted through the clock transmission line, into a CMOS level in response to the enable signal, a second clock converting unit configured to a swing region of the source clock into a CMOS level in response to the enable signal, a second clock driving unit configured to transfer an output clock of the second clock converting unit to the clock transmission line in response to the enable signal, a clock selecting unit configured to select one of the clock transmitted through the clock transmission line and an output clock of the first clock converting unit and a data output unit configured to output data in response to an output clock of the clock selecting unit.

In accordance with other aspect of the invention, there is provided a first clock driving unit configured to transfer a source clock swinging at a CML level to a first clock transmission line in response to an enable signal, a first clock converting unit configured to convert a swing region of the clock, which is transmitted through the first clock transmission line, into a CMOS level in response to the enable signal, a second clock converting unit configured to a swing region of the source clock into a CMOS level in response to the enable signal, a second clock driving unit configured to transfer an output clock of the second clock converting unit to a second clock transmission line in response to the enable signal and a data output unit configured to output data in response to an output clock of the first clock converting unit and a clock transmitted through the second clock transmission line.

In accordance with other aspect of the invention, there is provided receiving a clock swinging at a CML level through a clock transmission line when a frequency of the clock falls within a first frequency range, and converting the received clock into a clock swinging at a CMOS level and converting a clock swinging at a CML level into a clock swinging at a CMOS level when a frequency of the clock swinging at the CML level falls within a second frequency range lower than the first frequency range, and transferring the converted clock through the clock transmission line.

DESCRIPTION OF SPECIFIC EMBODIMENTS

Hereinafter, a semiconductor memory device in accordance with the present invention will be described in detail with reference to the accompanying drawings.

First Embodiment

Figure 1:
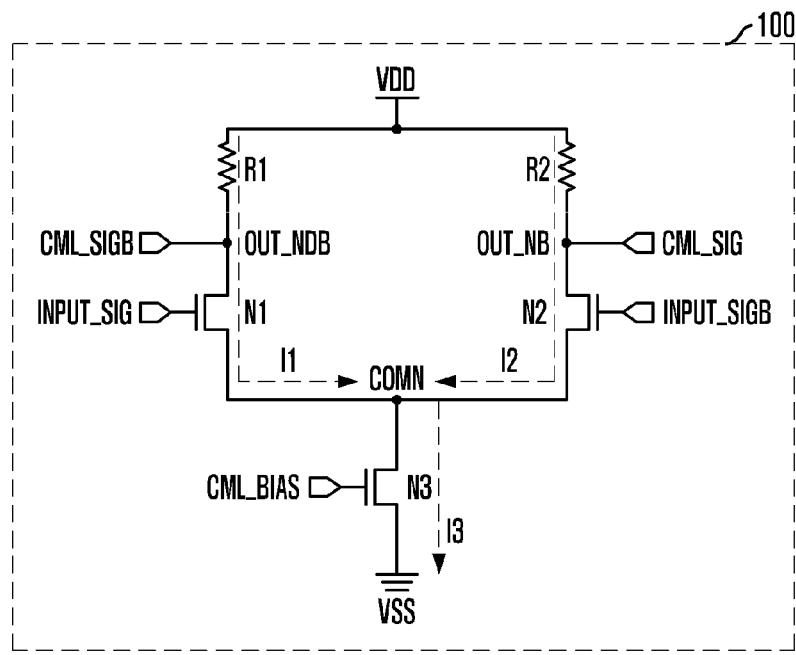
FIG. 1 illustrates a circuit for generating or transmitting a signal swinging at a CML level and a circuit for generating and transmitting a signal swinging at a CMOS level in a conventional semiconductor memory device.
Figure 1:
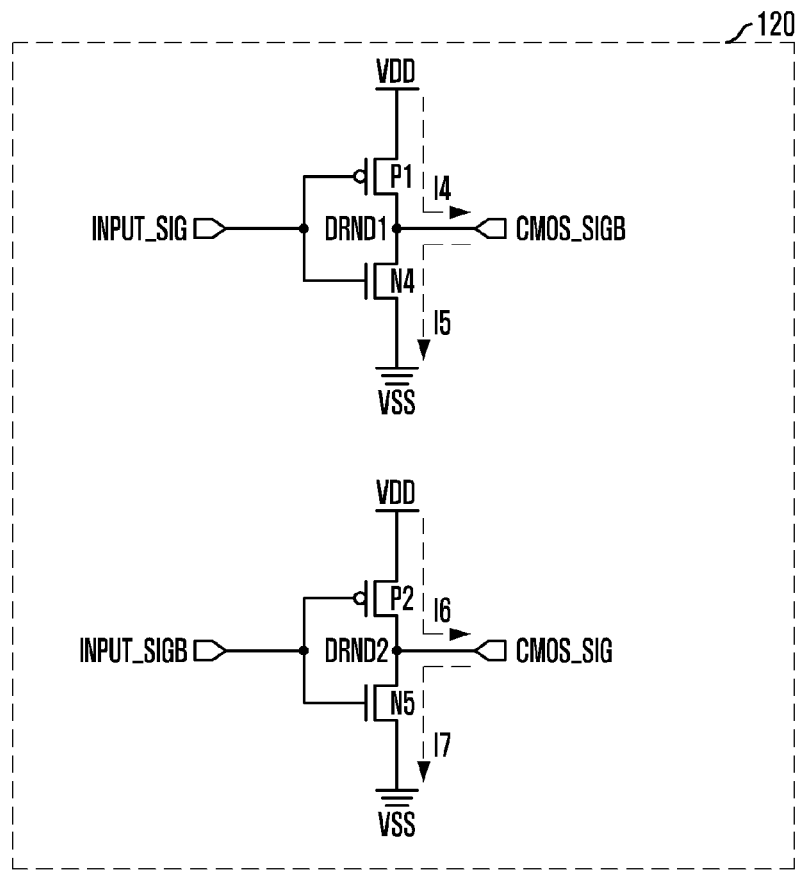
Figure 2:
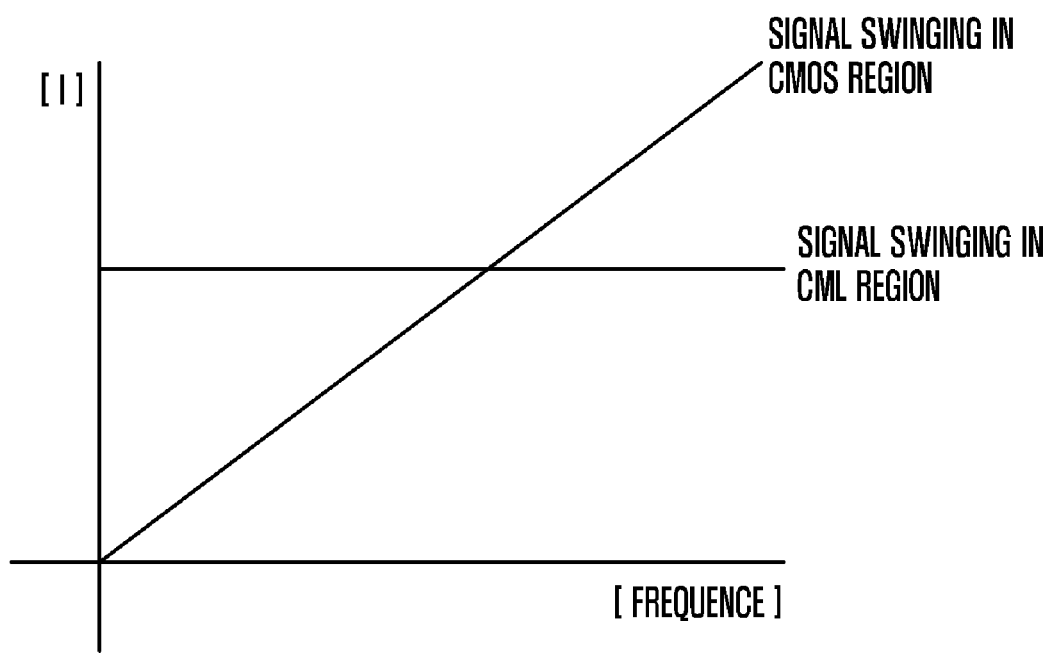
FIG. 2 is a graph for comparing an amount of current consumed according to variation of an operating frequency in the circuit for generating or transmitting the signals swinging at the CML level and the circuit for generating or transmitting the signals swinging at the CMOS level in the conventional semiconductor memory device of FIG. 1.
Figure 3:
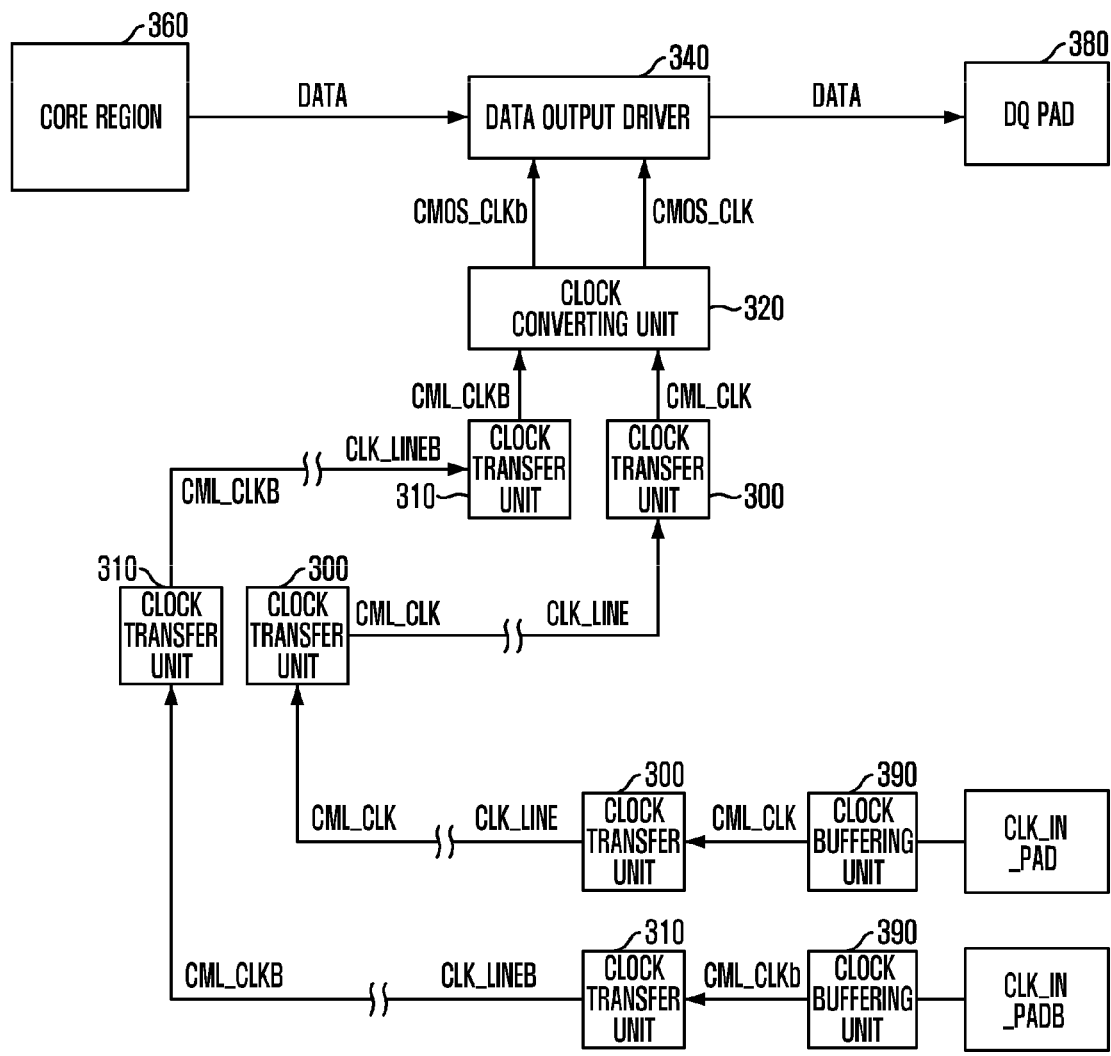
FIG. 3 is a block diagram illustrating a path through which a signal swinging at a CML level is transmitted to a data output driver in a conventional semiconductor memory device.
Figure 4:
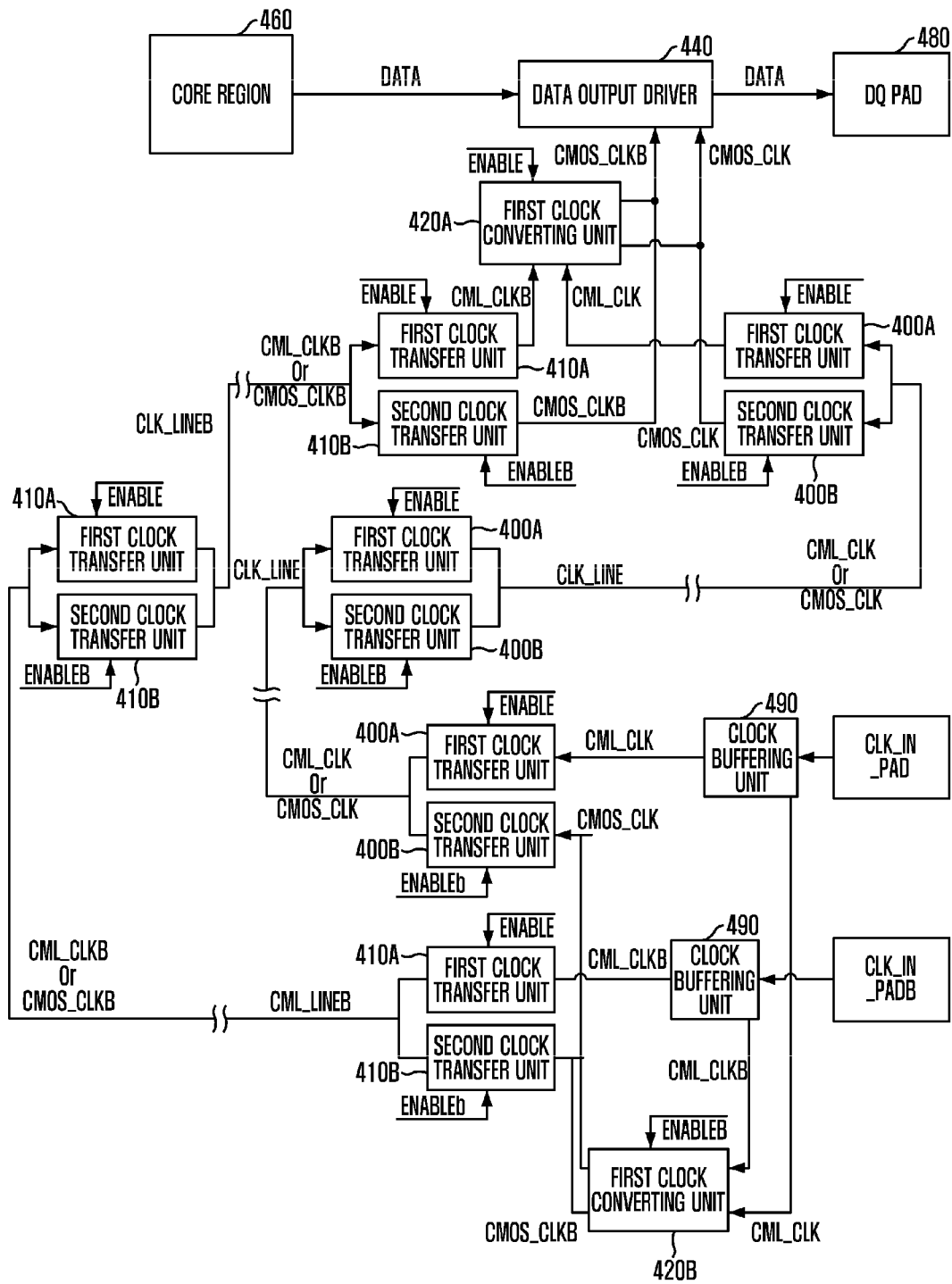
FIG. 4 is a block diagram illustrating a path through which a signal swinging at a CML level is transmitted to a data output driver in a semiconductor memory device in accordance with a first embodiment of the present invention.

FIG. 4 is a block diagram illustrating a path through which a signal swinging at a CML level is transmitted to a data output driver in a semiconductor memory device in accordance with a first embodiment of the invention.

Referring to FIG. 4, the following description will be made on the path through which signals CML_CLK and CML_CLKB swinging at the CML level are transmitted to a data output driver 440 in a semiconductor memory device in accordance with a first embodiment of the invention. First, source clocks CML_CLK and CML_CLKB applied through clock input pads CLK_IN_PAD and CLK_IN_PADB in response to an enable signal ENABLE and swinging at a CML level are input through clock transmission lines CLK_LINE and CLK_LINEB. Thereafter, first clock transmission paths 400A, 410A and 420A convert the source clocks CML_CLK and CML_CLKB into clocks CMOS_CLK and CMOS_CLKB swinging at a CMOS level. The source clocks CML_CLK and CML_CLKB applied through the clock input pads CLK_IN_PAD and CLK_IN_PADB in response to the enable signal ENABLEB and swinging at the CML level are converted into clocks CMOS_CLK and CMOS_CLKB swinging at the CMOS level. Thereafter, second clock transmission paths 420B, 400B and 410B receive source clocks CML_CLK and CML_CLKB through the clock transmission lines CLK_LINE and CLK_LINEB. Data output units 440 and 480 output data DATA in response to the output clocks CMOS_CLK and CMOS_CLKB of the first clock transmission paths 400A, 410A and 420A and the second clock transmission paths 420B, 400B and 410B.

In addition, a clock buffering unit 490 buffers the source clocks CML_CLK and CML_CLKB applied through the clock input pads CLK_IN_PAD and CLK_IN_PADB and swinging at the CML level, and outputs them to the first clock transmission paths 400A, 410A and 420A and the second clock transmission paths 420B, 400B and 410B.

The first clock transmission paths 400A, 410A and 420A include clock driving units 400A and 410A for driving the clock transmission lines CLK_LINE and CLK_LINEB with the source clocks CML_CLK and CLK_CLKB swinging at the CML level in response to the enable signal ENABLE, and a clock swing region converting unit 420A for converting a swing region of the source clocks CML_CLK and CLK_CLKB, which are driven at the clock transmission lines CLK_LINE and CLK_LINEB and swing at the CML level, into the clocks CMOS_CLK and CMOS_CLKB swinging at the CMOS level in response to the enable signal ENABLE.

In addition, the second clock transmission paths 420B, 400B and 410B includes a clock swing region converting unit 420B for converting a swing region of the source clocks CML_CLK and CML_CLKB swinging at the CML level into the clocks CMOS_CLK and CMOS_CLKB swinging at the CMOS level in response to the enable signal ENABLEB, and clock driving units 400B and 410B for driving the clock transmission lines CLK_LINE and CLK_LINEB with the clocks CMOS_CLK and CMOS_CLKB, which are output from the clock swing region converting unit 420B and swing at the CMOS level, in response to the enable signal ENABLE.

The data output units 440 and 480 include the data output driver 440 and the data output pad 480, and transmit the output data DATA of a core region 460 to the data output pad 480 in response to the clocks CMOS_CLK and CMOS_CLKB, which are output from the first clock transmission paths 400A, 410A and 420A and the second clock transmission paths 400A, 410A and 420A and swing at the CMOS level.

That is, the data output units 440 and 480 output the output data DATA of the core region 460 in synchronization with clock edges of the clocks CMOS_CLK and CMOS_CLKB, which are output from the first clock transmission paths 400A, 410A and 420A and the second clock transmission paths 400A, 410A and 420A and swing at the CMOS level.

For reference, the enable signal ENABLE for controlling the operation of the first clock transmission paths 400A, 410A and 420A, and the enable signal ENABLEB for controlling the operation of the second clock transmission paths 420B, 400B and 410B are differently shown in FIG. 4. However, when explaining the structure shown in FIG. 4, the two enable signals ENABLE and ENABLEB will be referred to as an enable signal. This is because the enable signal ENABLE and the enable signal ENABLEB are the substantially same signal while they have the opposite phases. That is, the different reference numerals are merely used in order to represent that the operation period of the first clock transmission paths 400A, 410A and 420A is different from that of the second clock transmission paths 420B, 400B and 410B. Substantially, the operation period of the first clock transmission paths 400A, 410A and 420A and the operation period of the second clock transmission paths 420B, 400B and 410B can be defined in response to the same enable signal.

Therefore, the activation of the enable signals ENABLE and ENABLEB are activated means that the enable signal ENABLE for controlling the operation of the first clock transmission paths 400A, 410A and 420B is activated to a logic high level, and the enable signal ENABLEB for controlling the operation of the second clock transmission paths 420B, 400B and 410B is deactivated to a logic low level.

Likewise, the deactivation of the enable signals ENABLE and ENABLEB means that the enable signal ENABLE for controlling the operation of the first clock transmission paths 400A, 410A and 420B is deactivated to a logic low level, and the enable signal ENABLEB for controlling the operation of the second clock transmission paths 420B, 400B and 410B is activated to a logic high level.

Therefore, the first clock transmission paths 400A, 410A and 420A operate during the activation period of the enable signals ENABLE and ENABLEB to output the source clocks CMOS_CLK and CMOS_CLKB converted to swing at the CMOS level, and do not operate during the deactivation period of the enable signals ENABLE and ENABLEB.

On the contrary, the second clock transmission paths 420B, 400B and 410B do not operate during the activation period of the enable signals ENABLE and ENABLEB, and output the source clocks CMOS_CLK and CMOS_CLKB, which are converted to swing at the CMOS level, during the deactivation period of the enable signals ENABLE and ENABLEB.

Also, it is possible to define the operation period of the first clock transmission paths 400A, 410A and 420A and the operation period of the second clock transmission paths 420B, 400B and 410B by using two signals that are completely different from each other. However, the activation periods of the completely differently signals should not overlap each other. That is, it is impossible to overlap the operation period of the first clock transmission paths 400A, 410A and 420A with the operation period of the second clock transmission paths 420B, 400B and 410B.

The following description will be made on an operation of the path through which the signals swinging at the CML level are transmitted to the data output driver in the semiconductor memory device in accordance with the first embodiment of the invention.

The enable signal ENABLE for controlling the operation of the first clock transmission paths 400A, 410A and 420A is activated to a logic high level, and the enable signal ENABLEB for controlling the operation of the second clock transmission paths 420B, 400B and 410B is deactivated to a logic low level. In this case, the path through which the signals CML_CLK and CML_CLKB swinging at the CML level are transmitted to the data output driver 440 in the semiconductor memory device in accordance with the first embodiment of the invention is operated using elements included in the first clock transmission paths 400A, 410A and 420A. Thus, the operation of the path is identical to the operation of the conventional path through which the signals CML_CLK and CML_CLKB swinging at the CML level are transmitted to the data output driver 340.

Specifically, the positive source clock CML_CLK and the negative source clock CML_CLKB, which are input through the positive clock input pad CLK_IN_PAD and the negative clock input pad CLK_IN_PADB and swing at the CML level, are loaded on the clock transmission lines CLK_LINE and CLK_LINEB in such a state that they are swung at the CML level by the first clock driving units 400A and 410A of the first clock transmission paths 400A, 410A and 420A. The source clocks CML_CLK and CML_CLKB loaded on the clock transmission lines CLK_LINE and CLK_LINEB are converted into the clocks CMOS_CLK and CMOS_CLKB such that they are swung at the CMOS level by the first clock converting unit 420A of the first clock transmission paths 400A, 410A and 420A, immediately before they are transmitted to the data output driver 440.

Therefore, the data output driver 440 transfers the output data DATA of the core region 460 to the data output pad 480 in response to the clocks CMOS_CLK and CMOS_CLKB swinging at the CMOS level, which are output from the first clock transmission paths 400A, 410A and 420A.

At this point, since the second clock transmission paths 400B, 410B and 420B do not operate, the clocks CMOS_CLK and CMOS_CLKB swinging at the CMOS level are not output.

When the enable signal ENABLE for controlling the operation of the first clock transmission paths 400A, 410A and 420A is deactivated to a logic low level and the enable signal ENABLEB for controlling the operation of the second clock transmission paths 420B, 400B and 410B is activated to a logic high level, the path through which the signals CML_CLK and CML_CLKB swinging at the CML level are transmitted to the data output driver 440 is operated using elements included in the second clock transmission paths 420B, 400B and 410B.

Specifically, the positive source clock CML_CLK and the negative source clock CML_CLKB, which are input through the positive clock input pad CLK_IN_PAD and the negative clock input pad CLK_IN_PADB and swing at the CML level, are converted into the clocks CMOS_CLK and CMOS_CLKB such that they are swung at the CMOS level by the second clock converting unit 420B of the second clock transmission paths 420B, 400B and 410B. The converted clocks are loaded on the clock transmission lines CLK_LINE and CLK_LINEB in such a state they are swung at the CMOS level by the second clock driving units 400B and 410B of the second clock transmission paths 420B, 400B and 410B, and the source clocks CMOS_CLK and CMOS_CLKB loaded on the clock transmission lines CLK_LINE and CLK_LINEB are applied to the data output driver 440.

Therefore, the data output driver 440 tran/sfers the output data DATA of the core region 460 to the data output pad 480 in response to the clocks CMOS_CLK and CMOS_CLKB swinging at the CMOS level, which are output from the second clock transmission paths 420B, 400B and 410B.

At this point, since the first clock transmission paths 400A, 410A and 420A do not operate, the clocks CMOS_CLK and CMOS_CLKB swinging at the CMOS level are not output.

Although the enable signals ENABLE and ENABLEB are important signals to define the operation period of the first clock transmission paths 400A, 410A and 420A and the operation period of the second clock transmission paths 420B, 400B and 410B, elements for generating the enable signals ENABLE and ENABLEB are not shown. This is because the enable signals ENABLE and ENABLEB can be generated under the following various conditions.

First, the semiconductor memory device should include elements for activating the enable signals ENABLE and ENABLEB when the frequencies of the source clocks CML_CLK and CML_CLKB applied through the clock input pads CLK_IN_PAD and CLK_IN_PADB fall within a first frequency range and for deactivating the enable signals ENABLE and ENABLEB when the frequencies of the source clocks CML_CLK and CML_CLKB applied through the clock input pads CLK_IN_PAD and CLK_IN_PADB fall within a second frequency range lower than the first frequency range. At this point, the semiconductor memory device should further include elements for detecting the frequencies of the source clocks CML_CLK and CML_CLKB swinging at the CML level in order to previously know whether the frequencies of the source clocks CML_CLK and CML_CLK applied through the clock input pads CLK_IN_PAD and CLK_IN_PADB fall within the first frequency range or the second frequency range.

Second, the activation period and the deactivation period of the enable signals ENABLE and ENABLEB may be defined by a memory register set (MRS) inside the semiconductor memory device.

Third, the semiconductor memory device may include elements for activating the enable signals ENABLE and ENABLEB when the device is operating in a normal mode, and deactivating the enable signals ENABLE and ENABLEB when the device is operating in a low power mode and a low speed test mode.

Fourth, by providing signal input pads for receiving the enable signals ENABLE and ENABLEB, the activation period and the deactivation period of the enable signals ENABLE and ENABLEB may be controlled at the outside of the semiconductor memory device.

In the above-described structure, the source clocks CML_CLK and CML_CLKB swinging at the CML level are shown as if they are comprised of the positive source clock CML_CLK and the negative source clock CML_CLK having the opposite phases, but they can also be comprised of much more clocks. That is, the source clocks may be comprised of a plurality of multi source clocks generated in a multi phase scheme. For example, when the multi source clocks have a 90-degree phase difference, the source clocks may include a 0-degree multi source clock CML_CLK_0, a 90-degree multi source clock CML_CLK_90, a 180-degree multi source clock CML_CLK_180, and a 270-degree multi source clock CML_CLK_270.

As described above, when the semiconductor memory device intends to be used under a low power or low speed frequency environment, the current consumption can be minimized by deactivating the enable signals ENABLE and ENABLEB so that the clocks CML_CLK and CML_CLKB applied to the semiconductor memory device can be transmitted through the internal clock transmission lines CLK_LINE and CLK_LINEB in such a state the clocks CML_CLK and CML_CLKB swing at the CMOS level.

Likewise, when the semiconductor memory device intends to be used under a normal power or low speed frequency environment, the current consumption can be minimized by activating the enable signals ENABLE and ENABLEB so that the clocks CML_CLK and CML_CLKB applied to the semiconductor memory device can be transmitted through the internal clock transmission lines CLK_LINE and CLK_LINEB in such a state the clocks CML_CLK and CML_CLKB swing at the CML level.

Second Embodiment

Figure 5:
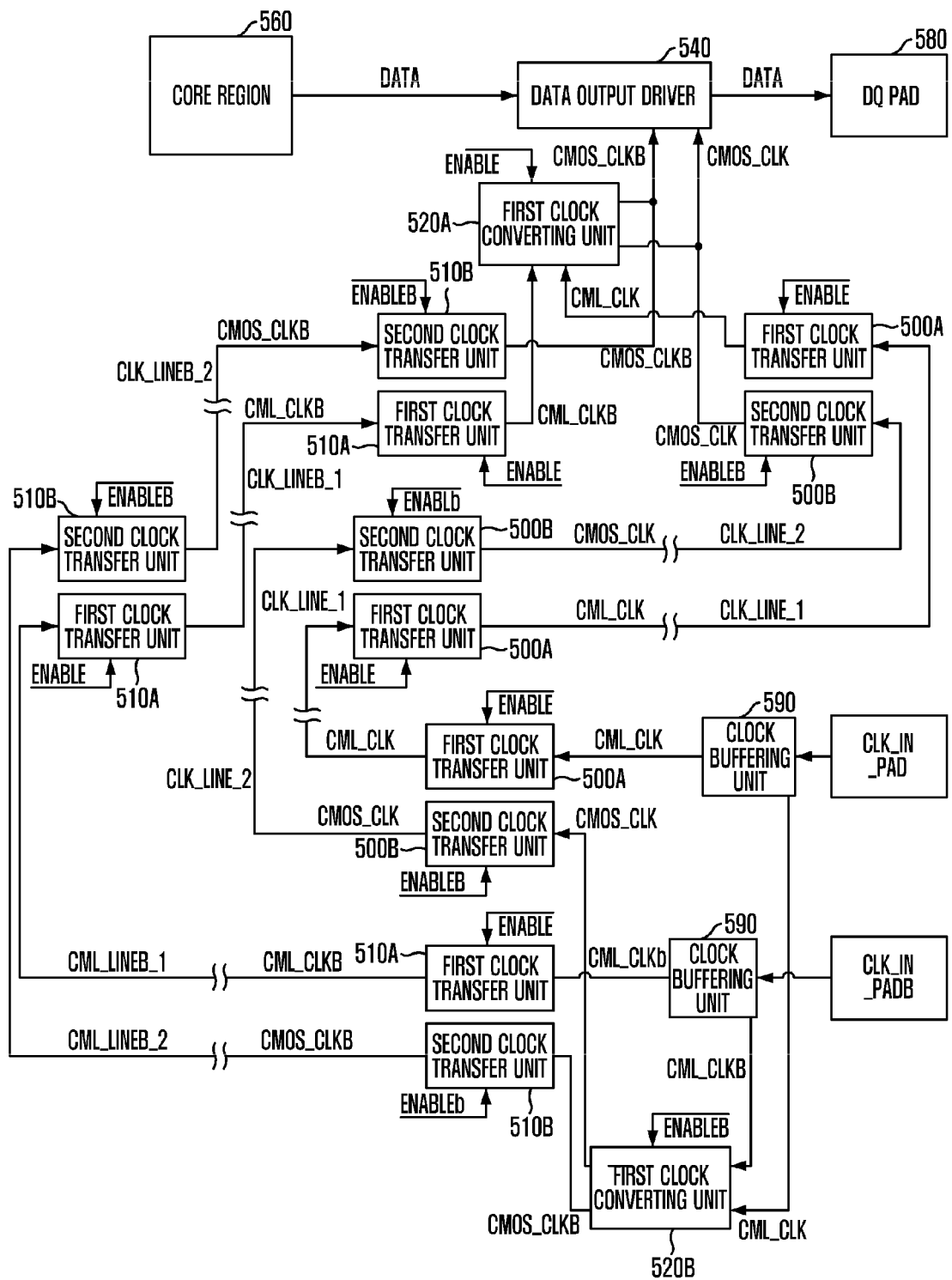
FIG. 5 is a block diagram illustrating a path through which a signal swinging at a CML level is transmitted to a data output driver in a semiconductor memory device in accordance with a second embodiment of the invention.

FIG. 5 is a block diagram illustrating a path through which a signal swinging at a CML level is transmitted to a data output driver in a semiconductor memory device in accordance with a second embodiment of the invention.

Referring to FIG. 5, the following description will be made on the path through which signals CML_CLK and CML_CLKB swinging at the CML level are transmitted to a data output driver 540 in a semiconductor memory device in accordance with a second embodiment of the invention. First, first clock transmission paths 500A, 510A and 520A receive source clocks CML_CLK and CML_CLKB, which are applied through clock input pads CLK_IN_PAD and CLK_IN_PADB in response to an enable signal ENABLE and swing at a CML level, through first clock transmission lines CLK_LINE_1 and CLK_LINEB_1, and convert the source clocks CML_CLK and CML_CLKB into clocks CMOS_CLK and CMOS_CLKB swinging at a CMOS level. Second clock transmission paths 520B, 500B and 510B convert the source clocks CML_CLK and CML_CLKB, which are applied through the clock input pads CLK_IN_PAD and CLK_IN_PADB in response to the enable signal ENABLEB and swing at the CML level, into clocks CMOS_CLK and CMOS_CLKB swinging at the CMOS level, and transfer them through second clock transmission lines CLK_LINE_2 and CLK_LINEB_2. Data output units 540 and 580 output data DATA in response to the output clocks CMOS_CLK and CMOS_CLKB of the first clock transmission paths 500A, 510A and 520A and the second clock transmission paths 520B, 500B and 510B.

In addition, a clock buffering unit 590 buffers the source clocks CML_CLK and CML_CLKB, which are applied through the clock input pads CLK_IN_PAD and CLK_IN_PADB and swing at the CML level, and then outputs them to the first clock transmission paths 500A, 510A and 520A and the second clock transmission paths 520B, 500B and 510B.

The first clock transmission paths 500A, 510A and 520A include clock driving units 500A and 510A for driving the first clock transmission lines CLK_LINE_1 and CLK_LINEB_1 with the source clocks CML_CLK and CML_CLKB swinging at the CML level in response to the enable signal ENABLE, and a clock swing region converting unit 520A for converting a swing region of the source clocks CML_CLK and CLK_CLKB, which are driven at the first clock transmission lines CLK_LINE_1 and CLK_LINEB_1 and swing at the CML level, into the clocks CMOS_CLK and CMOS_CLKB swinging at the CMOS level in response to the enable signal ENABLE.

In addition, the second clock transmission paths 520B, 500B and 510B includes a clock swing region converting unit 520B for converting a swing region of the source clocks CML_CLK and CML_CLKB swinging at the CML level into the clocks CMOS_CLK and CMOS_CLKB swinging at the CMOS level in response to the enable signal ENABLEB, and clock driving units 500B and 510B for driving the second clock transmission lines CLK_LINE_2 and CLK_LINEB_2 with the clocks CMOS_CLK and CMOS_CLKB, which are output from the clock swing region converting unit 520B and swing at the CMOS level, in response to the enable signal ENABLE.

The data output units 540 and 580 include the data output driver 540 and the data output pad 580, and transmit the output data DATA of a core region 560 to the data output pad 580 in response to the clocks CMOS_CLK and CMOS_CLKB, which are output from the first clock transmission paths 500A, 510A and 520A and the second clock transmission paths 500A, 510A and 520A and swing at the CMOS level.

That is, the data output units 540 and 580 output the output data DATA of the core region 560 in synchronization with clock edges of the clocks CMOS_CLK and CMOS_CLKB, which are output from the first clock transmission paths 500A, 510A and 520A and the second clock transmission paths 500A, 510A and 520A and swing at the CMOS level.

For reference, the enable signal ENABLE for controlling the operation of the first clock transmission paths 500A, 510A and 520A, and the enable signal ENABLEB for controlling the operation of the second clock transmission paths 520B, 500B and 510B are differently shown in FIG. 5. However, when explaining the structure shown in FIG. 5, the two enable signals ENABLE and ENABLEB will be referred to as an enable signal. This is because the enable signal ENABLE and the enable signal ENABLEB are the substantially same signal while they have the opposite phases. That is, the different reference numerals are merely used in order to represent that the operation period of the first clock transmission paths 500A, 510A and 520A is different from that of the second clock transmission paths 520B, 500B and 510B. Substantially, the operation period of the first clock transmission paths 500A, 510A and 520A and the operation period of the second clock transmission paths 520B, 500B and 510B can be defined in response to the same enable signal.

Therefore, the activation of the enable signals ENABLE and ENABLEB means that the enable signal ENABLE for controlling the operation of the first clock transmission paths 500A, 510A and 520B is activated to a logic high level, and the enable signal ENABLEB for controlling the operation of the second clock transmission paths 520B, 500B and 510B is deactivated to a logic low level.

Likewise, the deactivation of the enable signals ENABLE and ENABLEB means that the enable signal ENABLE for controlling the operation of the first clock transmission paths 500A, 510A and 520B is deactivated to a logic low level, and the enable signal ENABLEB for controlling the operation of the second clock transmission paths 520B, 500B and 510B is activated to a logic high level.

Therefore, the first clock transmission paths 500A, 510A and 520A operate during the activation period of the enable signals ENABLE and ENABLEB to output the source clocks CMOS_CLK and CMOS_CLKB converted to swing at the CMOS level, and do not operate during the deactivation period of the enable signals ENABLE and ENABLEB.

On the contrary, the second clock transmission paths 520B, 500B and 510B do not operate during the activation period of the enable signals ENABLE and ENABLEB, and output the source clocks CMOS_CLK and CMOS_CLKB, which are converted to swing at the CMOS level, during the deactivation period of the enable signals ENABLE and ENABLEB.

Also, it is possible to define the operation period of the first clock transmission paths 500A, 510A and 520A and the operation period of the second clock transmission paths 520B, 500B and 510B by using two signals that are completely different from each other. However, the activation periods of the completely differently signals should not overlap each other. That is, it is impossible to overlap the operation period of the first clock transmission paths 500A, 510A and 520A with the operation period of the second clock transmission paths 520B, 500B and 510B.

The following description will be made on an operation of the path through which the signals swinging at the CML level are transmitted to the data output driver in the semiconductor memory device in accordance with the second embodiment of the invention.

The enable signal ENABLE for controlling the operation of the first clock transmission paths 500A, 510A and 520A is activated to a logic high level, and the enable signal ENABLEB for controlling the operation of the second clock transmission paths 520B, 500B and 510B is deactivated to a logic low level. In this case, the path through which the signals CML_CLK and CML_CLKB swinging at the CML level are transmitted to the data output driver 540 in the semiconductor memory device in accordance with the second embodiment of the invention is operated using elements included in the first clock transmission paths 500A, 510A and 520A.

Specifically, the positive source clock CML_CLK and the negative source clock CML_CLKB, which are input through the positive clock input pad CLK_IN_PAD and the negative clock input pad CLK_IN_PADB and swing at the CML level, are loaded on the first clock transmission lines CLK_LINE_1 and CLK_LINEB_1 in such a state that they are swung at the CML level by the first clock driving units 500A and 510A of the first clock transmission paths 500A, 510A and 520A. The source clocks CML_CLK and CML_CLKB loaded on the first clock transmission lines CLK_LINE_1 and CLK_LINEB_1 are converted into the clocks CMOS_CLK and CMOS_CLKB such that they are swung at the CMOS level by the first clock converting unit 520A of the first clock transmission paths 500A, 510A and 520A, immediately before they are transmitted to the data output driver 540.

Therefore, the data output driver 540 transfers the output data DATA of the core region 560 to the data output pad 580 in response to the clocks CMOS_CLK and CMOS_CLKB swinging at the CMOS level, which are output from the first clock transmission paths 500A, 510A and 520A.

At this point, since the second clock transmission paths 500B, 510B and 520B do not operate, the clocks CMOS_CLK and CMOS_CLKB swinging at the CMOS level are not output. That is, the second clock transmission paths 500B, 510B and 520B becomes a high impedance state.

When the enable signal ENABLE for controlling the operation of the first clock transmission paths 500A, 510A and 520A is deactivated to a logic low level and the enable signal ENABLEB for controlling the operation of the second clock transmission paths 520B, 500B and 510B is activated to a logic high level, the path through which the signals CML_CLK and CML_CLKB swinging at the CML level are transmitted to the data output driver 540 is operated using elements included in the second clock transmission paths 520B, 500B and 510B.

Specifically, the positive source clock CML_CLK and the negative source clock CML_CLKB, which are input through the positive clock input pad CLK_IN_PAD and the negative clock input pad CLK_IN_PADB and swing at the CML level, are converted into the clocks CMOS_CLK and CMOS_CLKB such that they are swung at the CMOS level by the second clock converting unit 520B of the second clock transmission paths 520B, 500B and 510B. The converted clocks are loaded on the second clock transmission lines CLK_LINE_2 and CLK_LINEB_2 in such a state they are swung at the CMOS level by the second clock driving units 500B and 510B of the second clock transmission paths 520B, 500B and 510B, and the source clocks CMOS_CLK and CMOS_CLKB loaded on the second clock transmission lines CLK_LINE_2 and CLK_LINEB_2 are applied to the data output driver 540.

Therefore, the data output driver 540 transfers the output data DATA of the core region 560 to the data output pad 580 in response to the clocks CMOS_CLK and CMOS_CLKB swinging at the CMOS level, which are output from the second clock transmission paths 520B, 500B and 510B.

At this point, since the first clock transmission paths 500A, 510A and 520A do not operate, the clocks CMOS_CLK and CMOS_CLKB swinging at the CMOS level are not output. That is, first clock transmission paths 500A, 510A and 520A become a high impedance state during a deactivation period of the enable signals ENABEL and ENABLEB.

Although the enable signals ENABLE and ENABLEB are important signals to define the operation period of the first clock transmission paths 500A, 510A and 520A and the operation period of the second clock transmission paths 520B, 500B and 510B, elements for generating the enable signals ENABLE and ENABLEB are not shown. This is because the enable signals ENABLE and ENABLEB can be generated under the following various conditions.

First, the semiconductor memory device should include elements for activating the enable signals ENABLE and ENABLEB when the frequencies of the source clocks CML_CLK and CML_CLKB applied through the clock input pads CLK_IN_PAD and CLK_IN_PADB fall within a first frequency range and for deactivating the enable signals ENABLE and ENABLEB when the frequencies of the source clocks CML_CLK and CML_CLKB applied through the clock input pads CLK_IN_PAD and CLK_IN_PADB fall within a second frequency range lower than the first frequency range.

At this point, the semiconductor memory device should further include elements for detecting the frequencies of the source clocks CML_CLK and CML_CLKB swinging at the CML level in order to previously know whether the frequencies of the source clocks CML_CLK and CML_CLK applied through the clock input pads CLK_IN_PAD and CLK_IN_PADB fall within the first frequency range or the second frequency range.

Second, the activation period and the deactivation period of the enable signals ENABLE and ENABLEB may be defined by a memory register set (MRS) inside the semiconductor memory device.

Third, the semiconductor memory device may include elements for activating the enable signals ENABLE and ENABLEB when the device is operating in a normal mode, and deactivating the enable signals ENABLE and ENABLEB when the device is operating in a low power mode and a low speed test mode.

Fourth, by providing signal input pads for receiving the enable signals ENABLE and ENABLEB, the activation period and the deactivation period of the enable signals ENABLE and ENABLEB may be controlled at the outside of the semiconductor memory device.

In the above-described structure, the source clocks CML_CLK and CML_CLKB swinging at the CML level are shown as if they are comprised of the positive source clock CML_CLK and the negative source clock CML_CLK having the opposite phases, but they can also be comprised of much more clocks.

That is, the source clocks may be comprised of a plurality of multi source clocks generated in a multi phase scheme.

For example, when the multi source clocks have a 90-degree phase difference, the source clocks may include a 0-degree multi source clock CML_CLK_0, a 90-degree multi source clock CML_CLK_90, a 180-degree multi source clock CML_CLK_180, and a 270-degree multi source clock CML_CLK_270.

The difference between the path of the semiconductor memory device in accordance with the first embodiment of the invention and the path of the semiconductor memory device in accordance with the second embodiment of the invention is as follows.

First, in accordance with the first embodiment of the invention, the clock transmission lines CLK_LINE and CLK_LINEB are shared by the first clock transmission paths 400A, 410A and 420A and the second clock transmission paths 420B, 400B and 410B. Thus, the clocks CML_CLK and CML_CLKB swinging at the CML level or the clocks CMOS_CLK and CMOS_CLKB swinging at the CMOS level may be transmitted through the clock transmission lines CLK_LINE and CLK_LINEB.

However, in accordance with the second embodiment of the invention, the first clock transmission paths 500A, 510A and 520A use the first clock transmission lines CLK_LINE_1 and CLK_LINEB_1, and the second clock transmission paths 520B, 500B and 510B uses the second clock transmission lines CLK_LINE_2 and CLK_LINEB_2. Thus, the clocks CML_CLK and CML_CLKB swinging at the CML level are transmitted through the first clock transmission lines CLK_LINE_1 and CLK_LINEB_2, while the clocks CMOS_CLK and CMOS_CLKB swinging at the CMOS level are transmitted through the second clock transmission lines CLK_LINE_2 and CLK_LINEB_2.

As described above, when the semiconductor memory device intends to be used under a low power or low speed frequency environment, the current consumption can be minimized by deactivating the enable signals ENABLE and ENABLEB so that the clocks CML_CLK and CML_CLKB applied to the semiconductor memory device can be transmitted through the internal clock transmission lines CLK_LINE and CLK_LINEB in such a state the clocks CML_CLK and CML_CLKB swing at the CMOS level.

Likewise, when the semiconductor memory device intends to be used under a normal power or low speed frequency environment, the current consumption can be minimized by activating the enable signals ENABLE and ENABLEB so that the clocks CML_CLK and CML_CLKB applied to the semiconductor memory device can be transmitted through the internal clock transmission lines CLK_LINE and CLK_LINEB in such a state the clocks CML_CLK and CML_CLKB swing at the CML level.

In accordance with the embodiments of the invention, the path for transferring the clocks swinging at the CML level are controlled differently according to the operation modes, thereby minimizing the current consumption without regard to the operation modes.

While the invention has been described with respect to the specific embodiments, it will be apparent to those skilled in the art that various changes and modifications may be made without departing from the spirit and scope of the invention as defined in the following claims.

It is apparent that positions and types of the logic gates and transistors described in the above embodiments should be differently implemented according to polarity of the input signals.

What is claimed is:

1. A semiconductor memory device, comprising:
    a first clock transmission path configured to receive a source clock swinging at a CML level through a clock transmission line in response to an enable signal, and convert the source clock into a clock swinging at a CMOS level;
    a second clock transmission path configured to convert the source clock into a clock swinging at a CMOS level in response to the enable signal, and output the converted clock through the clock transmission line; and
    a data output unit configured to output data in response to output clocks of the first and second clock transmission paths.

2. The semiconductor memory device as recited in claim 1, further comprising a clock buffering unit configured to buffer the source clock received through a clock input pad, and output the buffered source clock through the first and second clock transmission paths.

3. The semiconductor memory device as recited in claim 1, wherein the enable signal is activated when a frequency of the source clock falls within a first frequency range, and the enable signal is deactivated when the frequency of the source clock falls within a second frequency range lower than the first frequency range.

4. The semiconductor memory device as recited in claim 1, wherein an activation period and a deactivation period of the enable signal are previously defined by a memory register set (MRS).

5. The semiconductor memory device as recited in claim 1, wherein the enable signal is activated when the device is operating in a normal mode, and the enable signal is deactivated when the device is operating in a low power mode and a low speed test mode.

6. The semiconductor memory device as recited in claim 1, wherein the enable signal is input to the device through a signal input pad.

7. The semiconductor memory device as recited in claim 3, wherein the first clock transmission path operates during an activation period of the enable signal to output the converted source clock swinging at the CMOS level, and the first clock transmission path does not operate during a deactivation period of the enable signal.

8. The semiconductor memory device as recited in claim 3, wherein the second clock transmission path does not operate during an activation period of the enable signal, and the second clock transmission path operates during a deactivation period of the enable signal to output the converted source clock swinging at the CMOS level.

9. The semiconductor memory device as recited in claim 1, wherein the first clock transmission path includes
a clock driving unit configured to drive the clock transmission line with the source clock in response to the enable signal, and a clock swing region converting unit configured to convert a swing region of a clock driven on the clock transmission line into the CMOS level in response to the enable signal.

10. The semiconductor memory device as recited in claim 1, wherein the second clock transmission path includes
a clock swing region converting unit configured to convert a swing region of the source clock into the CMOS level in response to the enable signal, and a clock driving unit configured to drive the clock transmission line with an output clock of the clock swing region converting unit in response to the enable signal.

11. The semiconductor memory device as recited in claim 1, wherein the data output unit outputs data in synchronization with clock edges of clocks output from the first and second clock transmission paths.

12. The semiconductor memory device as recited in claim 1, wherein the source clock comprises a positive source clock and a negative source clock having opposite phases.

13. The semiconductor memory device as recited in claim 1, wherein the source clock comprises a plurality of multi source clocks generated in a multi phase scheme.

14. A semiconductor memory device, comprising:
a first clock driving unit configured to transfer a source clock swinging at a CML level to a clock transmission line in response to an enable signal;
a first clock converting unit configured to convert a swing region of the clock, which is transmitted through the clock transmission line, into a CMOS level in response to the enable signal;
a second clock converting unit configured to convert a swing region of the source clock into a CMOS level in response to the enable signal;
a second clock driving unit configured to transfer an output clock of the second clock converting unit to the clock transmission line in response to the enable signal;
a clock selecting unit configured to select one of the clock transmitted through the clock transmission line and an output clock of the first clock converting unit; and
a data output unit configured to output data in response to an output clock of the clock selecting unit.

15. The semiconductor memory device as recited in claim 14, further comprising a clock buffering unit configured to buffer the source clock received through a clock input pad, and output the buffered source clock through the first clock driving unit and the second clock converting unit.

16. The semiconductor memory device as recited in claim 14, wherein the enable signal is activated when a frequency of the source clock falls within a first frequency range, and the enable signal is deactivated when the frequency of the source clock falls within a second frequency range lower than the first frequency range.

17. The semiconductor memory device as recited in claim 14, wherein an activation period and a deactivation period of the enable signal are previously defined by a memory register set (MRS).

18. The semiconductor memory device as recited in claim 14, wherein the enable signal is activated when the device is operating in a normal mode, and the enable signal is deactivated when the device is operating in a low power mode and a low speed test mode.

19. The semiconductor memory device as recited in claim 14, wherein the enable signal is input to the device through a signal input pad.

20. The semiconductor memory device as recited in claim 16, wherein the first clock driving unit operates during an activation period of the enable signal to output the source clock to the clock transmission line, and the first clock driving unit does not operate during a deactivation period of the enable signal.

21. The semiconductor memory device as recited in claim 16, wherein the first clock converting unit operates during an activation period of the enable signal to convert a swing region of the clock transmitted through the clock transmission line into a CMOS level, and the first clock converting unit does not operate during a deactivation period of the enable signal.

22. The semiconductor memory device as recited in claim 16, wherein the second clock converting unit does not operate during an activation period of the enable signal, and the second clock converting unit operates during a deactivation period of the enable signal to convert a swing region of the source clock into a CMOS level.

23. The semiconductor memory device as recited in claim 16, wherein the second clock driving unit does not operate during an activation period of the enable signal, and the second clock driving unit operates during a deactivation period of the enable signal to transfer the output clock of the second clock converting unit to the clock transmission line.

24. The semiconductor memory device as recited in claim 16, wherein the clock selecting unit selects an output clock of the first clock converting unit during an activation period of the enable signal, and selects a clock transmitted through the clock transmission line during a deactivation period of the enable signal.

25. The semiconductor memory device as recited in claim 14, wherein the data output unit outputs data in synchronization with clock edges of clocks output from the first and second clock transmission paths.

26. The semiconductor memory device as recited in claim 14, wherein the source clock comprises a positive source clock and a negative source clock having opposite phases.

27. The semiconductor memory device as recited in claim 14, wherein the source clock comprises a plurality of multi source clocks generated in a multi phase scheme.

28. A semiconductor memory device, comprising:
- a first clock driving unit configured to transfer a source clock swinging at a CML level to a first clock transmission line in response to an enable signal;
- a first clock converting unit configured to convert a swing region of the source clock, which is transmitted through the first clock transmission line, into a CMOS level in response to the enable signal;
- a second clock converting unit configured to a swing region of the source clock into a CMOS level in response to the enable signal;
- a second clock driving unit configured to transfer an output clock of the second clock converting unit to a second clock transmission line in response to the enable signal; and
- a data output unit configured to output data in response to an output clock of the first clock converting unit and a clock transmitted through the second clock transmission line.

29. The semiconductor memory device as recited in claim 28, further comprising a clock buffering unit configured to buffer the source clock received through a clock input pad, and output the buffered source clock through the first clock driving unit and the second clock converting unit.

30. The semiconductor memory device as recited in claim 28, wherein the enable signal is activated when a frequency of the source clock falls within a first frequency range, and the enable signal is deactivated when the frequency of the source clock falls within a second frequency range lower than the first frequency range.

31. The semiconductor memory device as recited in claim 28, wherein an activation period and a deactivation period of the enable signal are previously defined by a memory register set (MRS).

32. The semiconductor memory device as recited in claim 28, wherein the enable signal is activated when the device is operating in a normal mode, and the enable signal is deactivated when the device is operating in a low power mode and a low speed test mode.

33. The semiconductor memory device as recited in claim 28, wherein the enable signal is input to the device through a signal input pad.

34. The semiconductor memory device as recited in claim 30, wherein the first clock driving unit operates during an activation period of the enable signal to output the source clock to the clock transmission line, and the first clock driving unit does not operate during a deactivation period of the enable signal.

35. The semiconductor memory device as recited in claim 30, wherein the first clock converting unit operates during an activation period of the enable signal to convert a swing region of the source clock transmitted through the first clock transmission line into a CMOS level, and the first clock converting unit does not operate during a deactivation period of the enable signal.

36. The semiconductor memory device as recited in claim 30, wherein the second clock converting unit does not operate during an activation period of the enable signal, and the second clock converting unit operates during a deactivation period of the enable signal to convert a swing region of the source clock into a CMOS level.

37. The semiconductor memory device as recited in claim 30, wherein the second clock driving unit does not operate during an activation period of the enable signal, and the second clock driving unit operates during a deactivation period of the enable signal to transfer the output clock of the second clock converting unit to the second clock transmission line.

38. The semiconductor memory device as recited in claim 30, wherein the source clock swinging at a CML level is transmitted through the first clock transmission line during an activation period of the enable signal, and the second clock transmission line becomes a high impedance state.

39. The semiconductor memory device as recited in claim 30, wherein the first clock transmission line becomes a high impedance state during a deactivation period of the enable signal, and the output clock of the second clock converting unit, which swings at a CMOS level, is transmitted through the second clock transmission line.

40. The semiconductor memory device as recited in claim 28, wherein the source clock comprises a positive source clock and a negative source clock having opposite phases.

41. The semiconductor memory device as recited in claim 28, wherein the source clock comprises a plurality of multi source clocks generated in a multi phase scheme.

42. An operating method of a semiconductor memory device, comprising:
- receiving a clock swinging at a CML level through a clock transmission line when a frequency of the clock falls within a first frequency range, and converting the received clock into a clock swinging at a CMOS level; and
- converting a clock swinging at a CML level into a clock swinging at a CMOS level when a frequency of the clock swinging at the CML level falls within a second frequency range lower than the first frequency range, and transferring the converted clock through the clock transmission line.

43. The operating method as recited in claim 42, further comprising detecting whether the frequency of the clock swinging at the CML level falls within the first frequency range or the second frequency range.

44. The operating method as recited in claim 42, wherein the converting of the received clock includes
- transferring the clock swinging at the CML level through the clock transmission line, and
- converting a swing region of the clock swinging at the CML level, which is transmitted through the clock transmission line, into a CMOS level.

45. The operating method as recited in claim 42, wherein the transferring of the converted clock includes
- converting a swing region of a clock swinging at a CML level into a CMOS level, and
- transferring the clock, whose swing region is converted into the CMOS level, through the clock transmission line.

* * * * *